(12) United States Patent  
Tetani et al.

(10) Patent No.: US 8,084,859 B2  
(45) Date of Patent: Dec. 27, 2011

(54) SEMICONDUCTOR DEVICE

(75) Inventors: Michinari Tetani, Osaka (JP); Minoru Fujisaku, Kyoto (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 12/207,790

(22) Filed: Sep. 10, 2008

(65) Prior Publication Data

US 2009/0096094 A1 Apr. 16, 2009

(30) Foreign Application Priority Data

Oct. 12, 2007 (JP) .................................. 2007-265973  
May 22, 2008 (JP) .................................. 2008-133712

(51) Int. Cl.  
*H01L 23/48* (2006.01)

(52) U.S. Cl. ........ 257/737; 257/678; 257/693; 257/758; 257/773; 257/776

(58) Field of Classification Search ........................ None  
See application file for complete search history.

(56) References Cited

U.S. PATENT DOCUMENTS 5,539,551 A * 7/1996 Nomoto et al. .................. 349/42  
2002/0140083 A1* 10/2002 Matsuda ....................... 257/711

FOREIGN PATENT DOCUMENTS

JP 07-273292 10/1995

* cited by examiner

*Primary Examiner* — N Drew Richards  
*Assistant Examiner* — Kyoung Lee  
(74) *Attorney, Agent, or Firm* — Steptoe & Johnson LLP

(57) ABSTRACT

In a wafer level CSP package, with respect to signal wiring 9b disposed in a signal wiring disposition forbidden region 16 in the vicinity of external output terminals disposed in a package outer peripheral portion, since a stress generated at signal wiring 9 can be dispersed by disposing dummy wiring 9a around the signal wiring 9b or by expanding the width of the signal wiring itself, occurrences of cracks in a surface protective film can be readily suppressed.

32 Claims, 10 Drawing Sheets

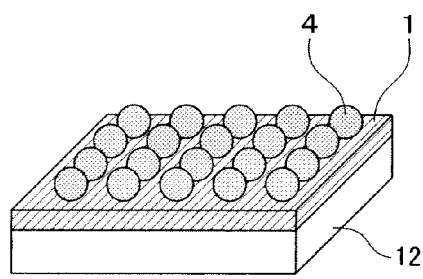
FIG. 3A
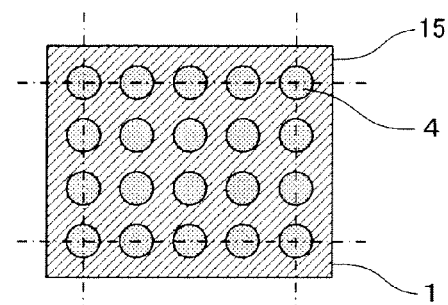
FIG. 3B
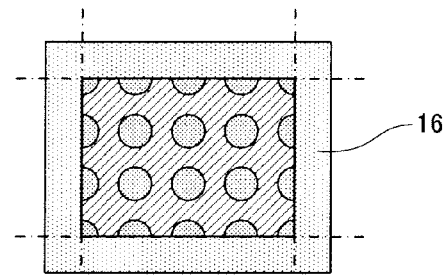
FIG. 3C
FIG. 4
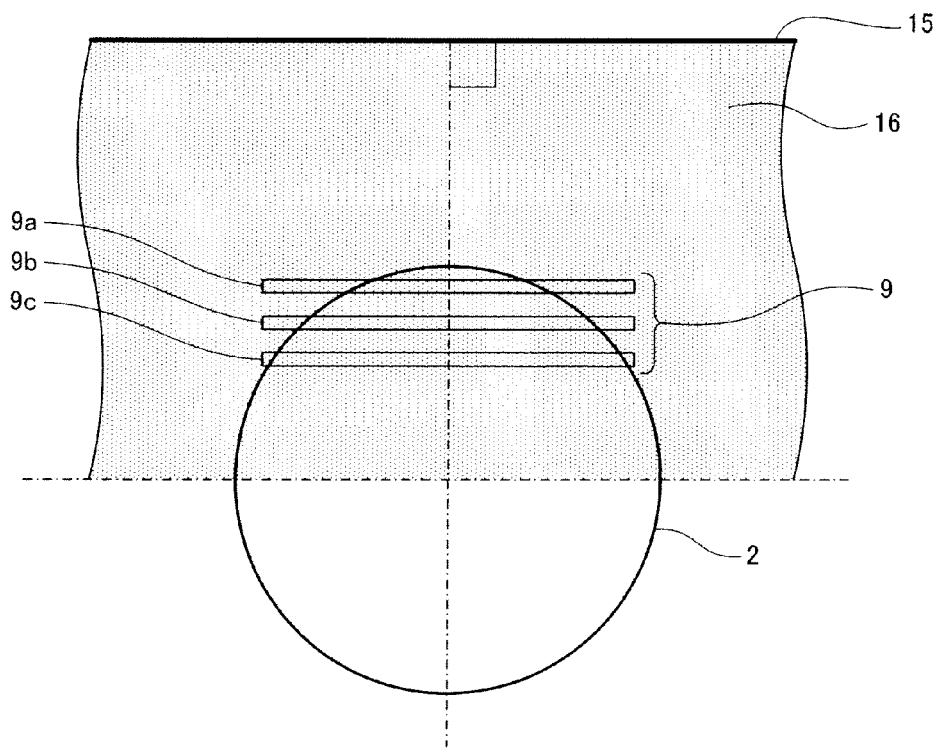

SEMICONDUCTOR DEVICE

FIELD OF THE INVENTION

The present invention relates to a semiconductor device having a wafer level chip scale package structure that is resin-molded in a semiconductor chip-state.

BACKGROUND OF THE INVENTION

In recent years, with semiconductor devices formed by packaging, downsizing and densification of packages themselves accompanying downsizing and enhanced functionality of electronic devices have led to demands for an increase in the number of terminals in the semiconductor devices. Accordingly, various chip scale packages (CSPs) are being developed as downsized packages having a large number of terminals.

In particular, a wafer level CSP (WLCSP) is recently attracting attention as a technique capable of realizing an ultimate miniature package equivalent to a bare chip. The WLCSP is formed by first forming an insulating resin film on the entire surface of a semiconductor wafer on which a plurality of integrated circuits is formed, next forming wiring that electrically connects pad electrodes of the integrated circuits with external terminals such as bumps via contact holes on the formed insulating resin film, and in a final step, splitting the semiconductor wafer into chips.

In addition, a semiconductor package has been released in which an inductor element, conventionally a so-called external part separate from a semiconductor chip, is formed on an insulating resin film in a WLCSP-type semiconductor device using material for wiring to external terminals. The WLCSP-type semiconductor device including an inductor element is also expected as a microminiature semiconductor package applicable to applications ranging from several hundred MHz to several GHz such as mobile devices, wireless LAN apparatuses, and the like.

A conventional semiconductor device will now be described in detail with reference to FIGS. 10, 11, 12 and 13.

FIG. 10 is a cross-sectional diagram of substantial parts of the configuration of a conventional semiconductor device and a corresponding wiring layout diagram; FIG. 11 is a diagram showing a mounted state of a conventional WLCSP; FIG. 12 is an enlarged view of substantial parts showing the mounted state of the conventional WLCSP; and FIG. 13 is a diagram showing a load applied in the vicinity of semiconductor wiring and a stress concentration site during mounting of the conventional WLCSP.

In addition, FIG. 12 is an enlarged view of section A shown in FIG. 11, and FIG. 13 is an enlarged view of section B shown in FIG. 12.

In FIGS. 10, 11, 12 and 13, reference numeral 1 denotes a molding resin, 2 a post, 3 rewiring, 4 a solder bump, 5 an insulating film, 6 an Al wiring pad, 7 an Al wiring inductor, 8 first signal wiring, 9 second signal wiring, 10 a surface protective film, 11 an interlayer insulating film, 12 a semiconductor substrate, 13 a mounting substrate, 14 a mounting substrate terminal, 17 a crack, 18 a WLCSP, and 19 a stress concentration site.

First, the configuration of a conventional semiconductor device will be described with reference to FIG. 10. As shown in FIG. 10, in a semiconductor device, for example, a semiconductor element such as an MOS transistor and a semiconductor element such as a diode, a bipolar transistor, or the like formed by a PN junction are formed on the semiconductor substrate 12. The semiconductor substrate 12 is covered by the interlayer insulating film 11 to protect the semiconductor elements. Also disposed on the semiconductor substrate 12 are; the first signal wiring 8 for conducting a signal from the semiconductor element; the second signal wiring 9 provided on the first signal wiring 8 and which is electrically insulated by the interlayer insulating film 11 using a multilayer wiring technique; the Al wiring inductor 7; and the Al wiring pad 6 for extracting signals to the outside. Such components are electrically or atmospherically insulated from the outside and protected by the surface protective film 10.

Next, wiring is disposed to under the solder bump 4 using the rewiring 3 in order to actually extract a signal from the Al wiring pad 6 to the outside. The solder bump 4 and the rewiring 3 are connected via the post 2 for increased mounting reliability. The post 2 and the rewiring 3 are protected from external impact and the atmosphere by the molding resin 1. In addition, the solder bump 4 to become a contact that connects to the mounting substrate is formed on the post 2. In consideration of inductor characteristics, wiring having a thick film thickness of around 2 µm is used for the second signal wiring 9, the Al wiring pad 6 and the Al wiring inductor 7. In comparison, the surface protective film 10 is thinly formed with respect to the second signal wiring 9.

Furthermore, the second signal wiring 9 is disposed directly beneath an outer peripheral portion of the post 2 as indicated in the section B in FIG. 12 at an outermost peripheral terminal of the WLCSP 18 as indicated in the section A in FIG. 11.

In FIG. 11, the WLCSP 18 is formed on the mounting substrate 13 with a face including the solder bumps 4 facing downwards, and is placed on the mounting substrate terminals 14. Subsequently, a heat treatment process (220 to 260 degrees C.) is performed and the solder bumps 4 are melted and joined with the mounting substrate terminals 14 (for example, refer to Patent Document 1).

FIG. 13 is a diagram of the WLCSP 18, in which the solder bumps 4 are disposed, showing load application states of peripheral members and the stress concentration site 19 during the heat treatment process with respect to the solder bumps 4 disposed at the outermost peripheral portion of the WLCSP 18 as well as the second signal wiring 9 and the surface protective film 10 disposed under the post 2.

DISCLOSURE OF THE INVENTION

Unfortunately, with a conventional WLCSP, in a case where the second signal wiring 9 shown in FIGS. 10 and 13 is disposed directly beneath the outer peripheral portion of the post 2, when the post 2 is disposed on the outer peripheral portion of a package in which output terminals of the WLCSP 18 are aligned, because the WLCSP is a package in which the WLCSP 18 is mounted in the mounting substrate 13 and intrapackage wiring to be used in the package is directly formed on the second signal wiring 9 and the surface protective film 10 as a result of heat treatment, a stress large enough to destroy the surface protective film 10 is generated on the second signal wiring 9 and the surface protective film 10, causing the crack 17 in the surface protective film 10.

A semiconductor device according to the present invention is oriented to solving the aforementioned problem existing in the conventional art, and an object of the present invention is to suppress occurrences of cracks without imposing a change in external shape or inducing additional processes or costs.

In order to achieve the aforementioned object, a semiconductor device according to the present invention is provided with a wafer level chip scale package structure having external terminals, wherein a region, on a plane parallel to a substrate principal plane, which exists between a line connecting the centroids of the adjacent external terminals and the edge of the semiconductor device package is assumed to be a signal wiring forbidden region, and the semiconductor device includes signal wiring disposed in the signal wiring forbidden region and dummy wiring disposed on the same wiring layer in the periphery of the signal wiring.

In addition, the signal wiring forbidden region is assumed to be a region in which a range having a fan angle of 140 degrees from the centroid of the external terminals, the center of the fan angle being a perpendicular line drawn from the edge of the semiconductor device package to the centroid on the plane parallel to the substrate principal plane, overlaps with a range enclosed by an arc whose center is the centroid and whose radius is 4/5 of a minimum distance to the edge of the external terminals and an arc whose center is the centroid and whose radius is 6/5 of a maximum distance to the edge of the external terminals.

Furthermore, the external terminal is formed by a bump whose plane parallel to the substrate principal plane has a circular shape, and the signal wiring forbidden region is assumed to be a region between a line connecting the center of the plane parallel to the substrate principal plane of the adjacent bump and the edge of the semiconductor device package.

Moreover, the external terminal is formed by a bump whose plane parallel to the substrate principal plane has a circular shape, and the signal wiring forbidden region is assumed to be a region in which a range having a fan angle of 140 degrees from the center of a planar circle of the external terminal, the center of the fan angle being a perpendicular line drawn from the edge of the semiconductor device package to the center of the planar circle of the external terminal, overlaps with a range enclosed by an arc whose center is the center of the planar circle and whose radius is 4/5 of the radius of the external terminals and an arc whose center is the center of the planar circle and whose radius is 6/5 of the radius of the external terminals.

Furthermore, the dummy wiring continuously encloses the periphery of the signal wiring with a gap of 2 µm or more between the dummy wiring and the signal wiring.

Moreover, at least one piece of the dummy wiring is disposed parallel to the signal wiring with a gap of at least the width of the signal wiring between the dummy wiring and the signal wiring.

Furthermore, at least one piece of the dummy wiring is disposed parallel to the signal wiring with a gap of 2 µm or more between the dummy wiring and the signal wiring.

Moreover, a semiconductor device according to the present invention is provided with a wafer level chip scale package structure having external terminals, wherein a region, on a plane parallel to a substrate principal plane, which exists between a line connecting the centroids of the adjacent external terminals and the edge of the semiconductor device package is assumed to be a signal wiring forbidden region, and signal wiring disposed in the signal wiring forbidden region is set to have a line width at least five times the thickness of the signal wiring.

Furthermore, the signal wiring forbidden region is assumed to be a region in which a range having a fan angle of 140 degrees from the centroid of the external terminals, the center of the fan angle being a perpendicular line drawn from the edge of the semiconductor device package to the centroid on the plane parallel to the substrate principal plane, overlaps with a range enclosed by an arc whose center is the centroid and whose radius is 4/5 of a minimum distance to the edge of the external terminals and an arc whose center is the centroid and whose radius is 6/5 of a maximum distance to the edge of the external terminals.

Moreover, the external terminal is formed by a bump whose plane parallel to the substrate principal plane has a circular shape, and the signal wiring forbidden region is assumed to be a region between a line connecting the center of the plane parallel to the substrate principal plane of the adjacent bump and the edge of the semiconductor device package.

Furthermore, the external terminal is formed by a bump whose plane parallel to the substrate principal plane has a circular shape, and the signal wiring forbidden region is assumed to be a region in which a range having a fan angle of 140 degrees from the center of a planar circle of the external terminals, the center of the fan angle being a perpendicular line drawn from the edge of the semiconductor device package to the center of the planar circle of the external terminal, overlaps with a range enclosed by an arc whose center is the center of the planar circle and whose radius is 4/5 of the radius of the external terminals and an arc whose center is the center of the planar circle and whose radius is 6/5 of the radius of the external terminals.

Moreover, a post is provided at a layer underneath the bump.

Furthermore, an underbump metal film is provided at a layer underneath the bump.

Moreover, the signal wiring disposed in the signal wiring forbidden region is set to have a line width of 10 µm or more.

Furthermore, the plurality of pieces of wiring is made of a material including Al, and has a thickness of 1.5 µm or more.

BRIEF DESCRIPTION OF THE DRAWINGS

FIG. 3A is a diagram illustrating, within a WLCSP, a signal wiring disposition forbidden region in the semiconductor device according to the present invention;

FIG. 3B is a diagram illustrating, within the WLCSP, the signal wiring disposition forbidden region in the semiconductor device according to the present invention;

FIG. 3C is a diagram illustrating, within the WLCSP, the signal wiring disposition forbidden region in the semiconductor device according to the present invention;

FIG. 4 is a diagram illustrating the proximity of the edge face of the WLCSP in the signal wiring disposition forbidden region in the semiconductor device according to the present invention;

DESCRIPTION OF THE EMBODIMENTS

Embodiments of the present invention will now be described in detail with reference to the drawings.

Figure 1:
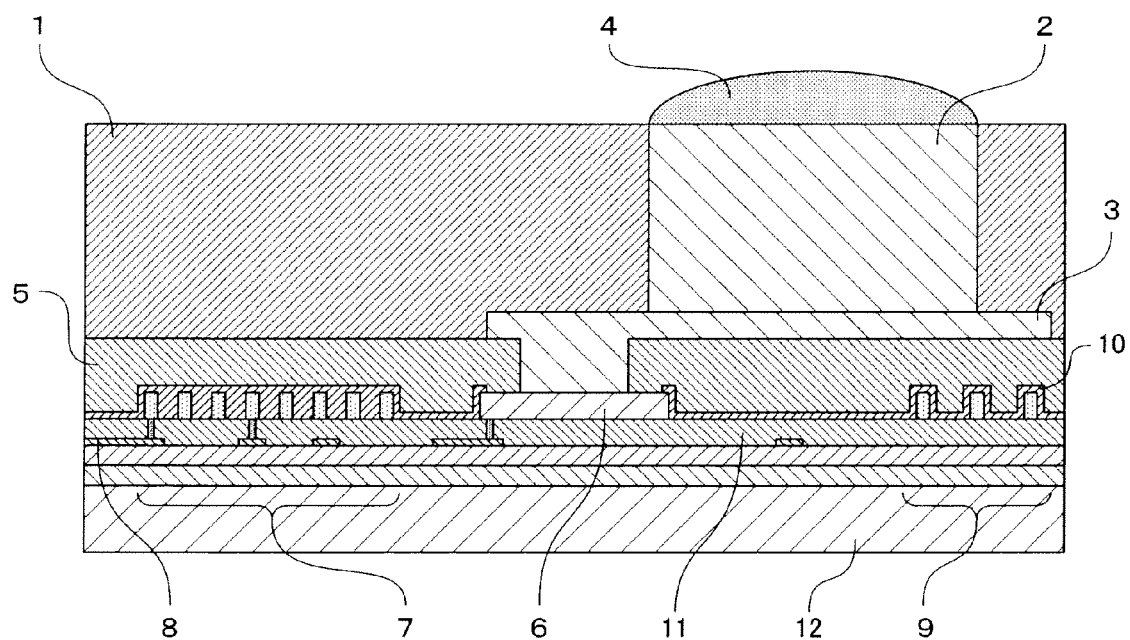
FIG. 1 is a cross-sectional diagram of substantial parts showing the configuration of a semiconductor device according to the present invention.
Figure 2:
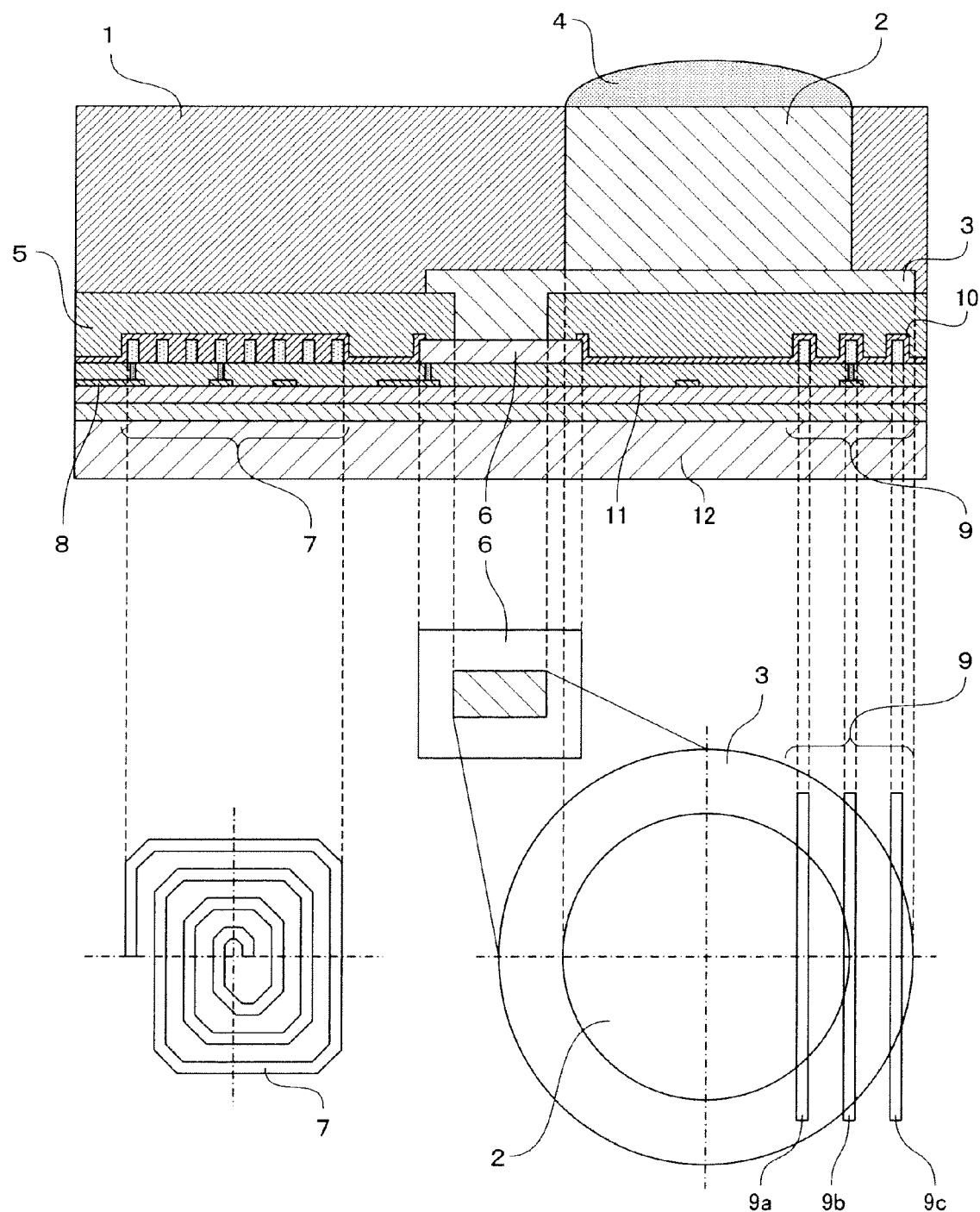
FIG. 2 is a cross-sectional diagram of substantial parts showing the configuration of the semiconductor device and a corresponding wiring layout plan view.
Figure 5:
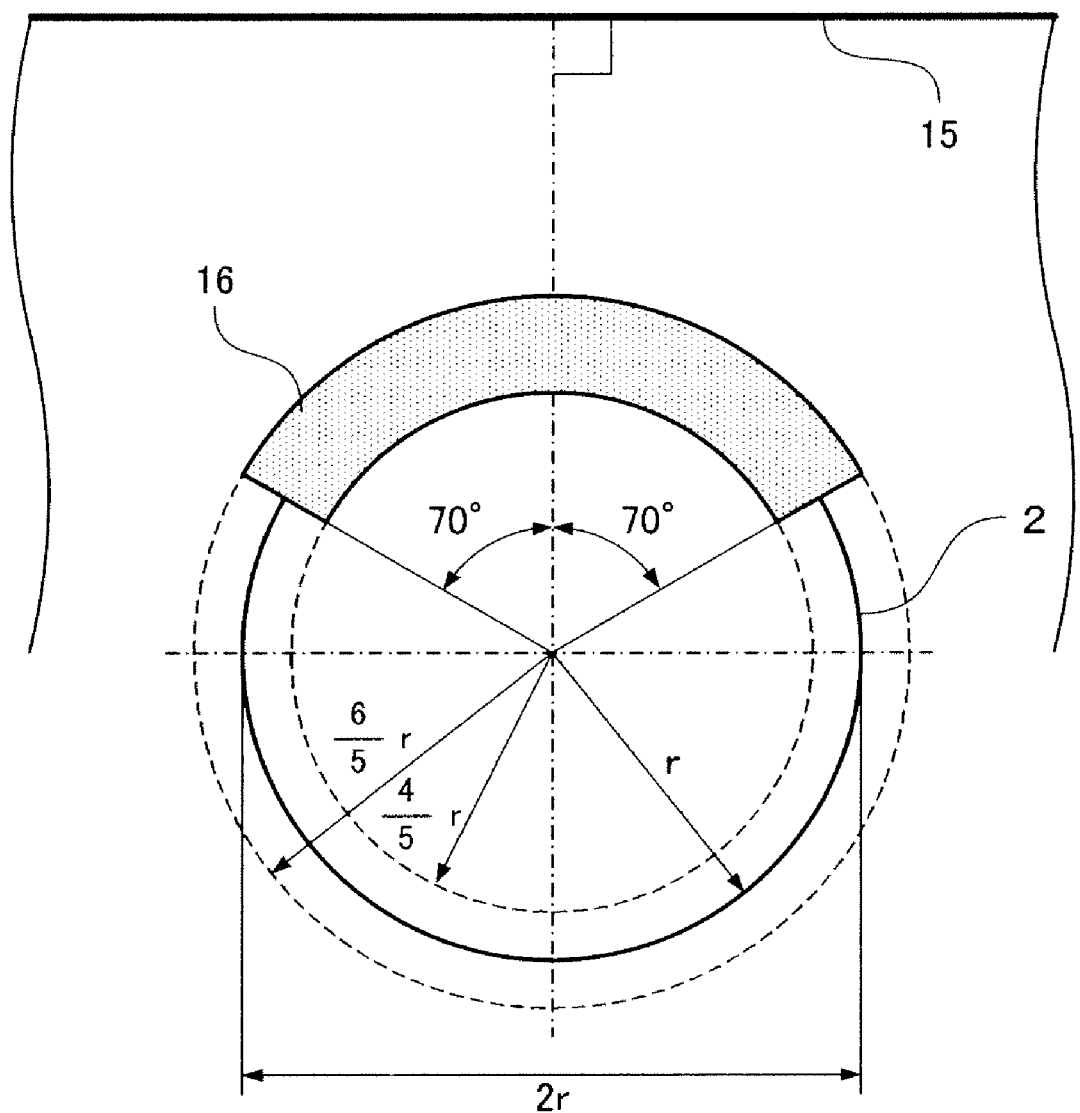
FIG. 5 is a diagram illustrating details of the signal wiring disposition forbidden region in the semiconductor device according to the present invention.
Figure 6:
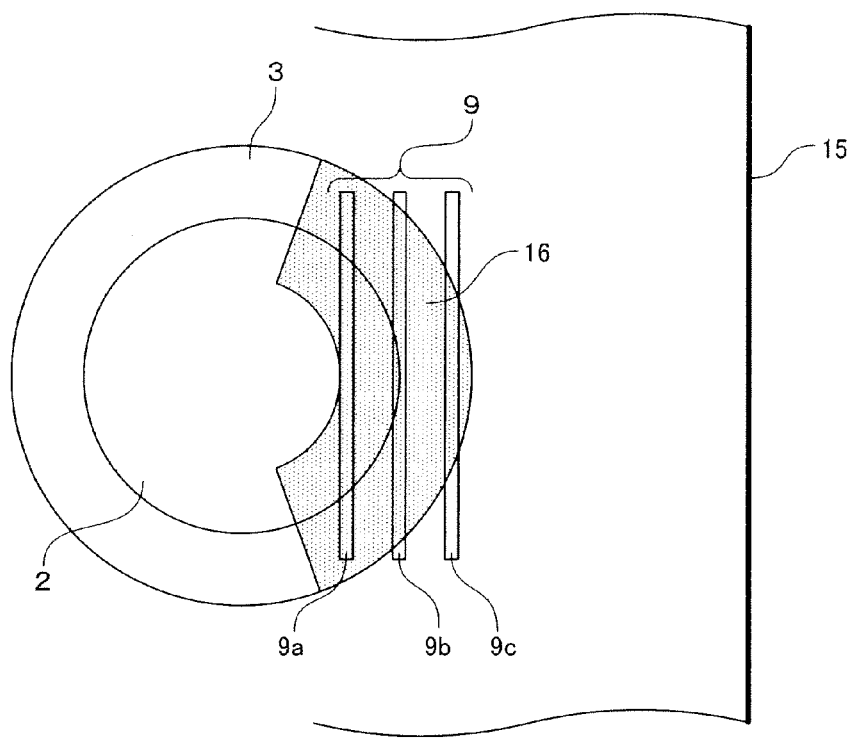
FIG. 6 is a diagram showing the configuration of signal wiring in a signal wiring disposition forbidden region according to a first embodiment.
Figure 7:
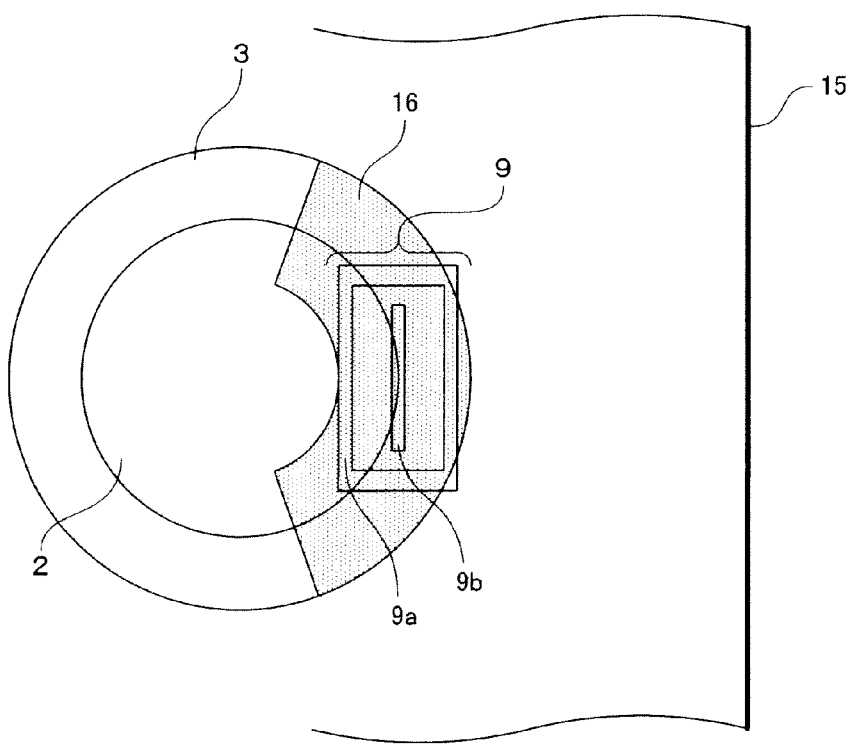
FIG. 7 is a diagram showing the configuration of signal wiring in a signal wiring disposition forbidden region according to a second embodiment.
Figure 8:
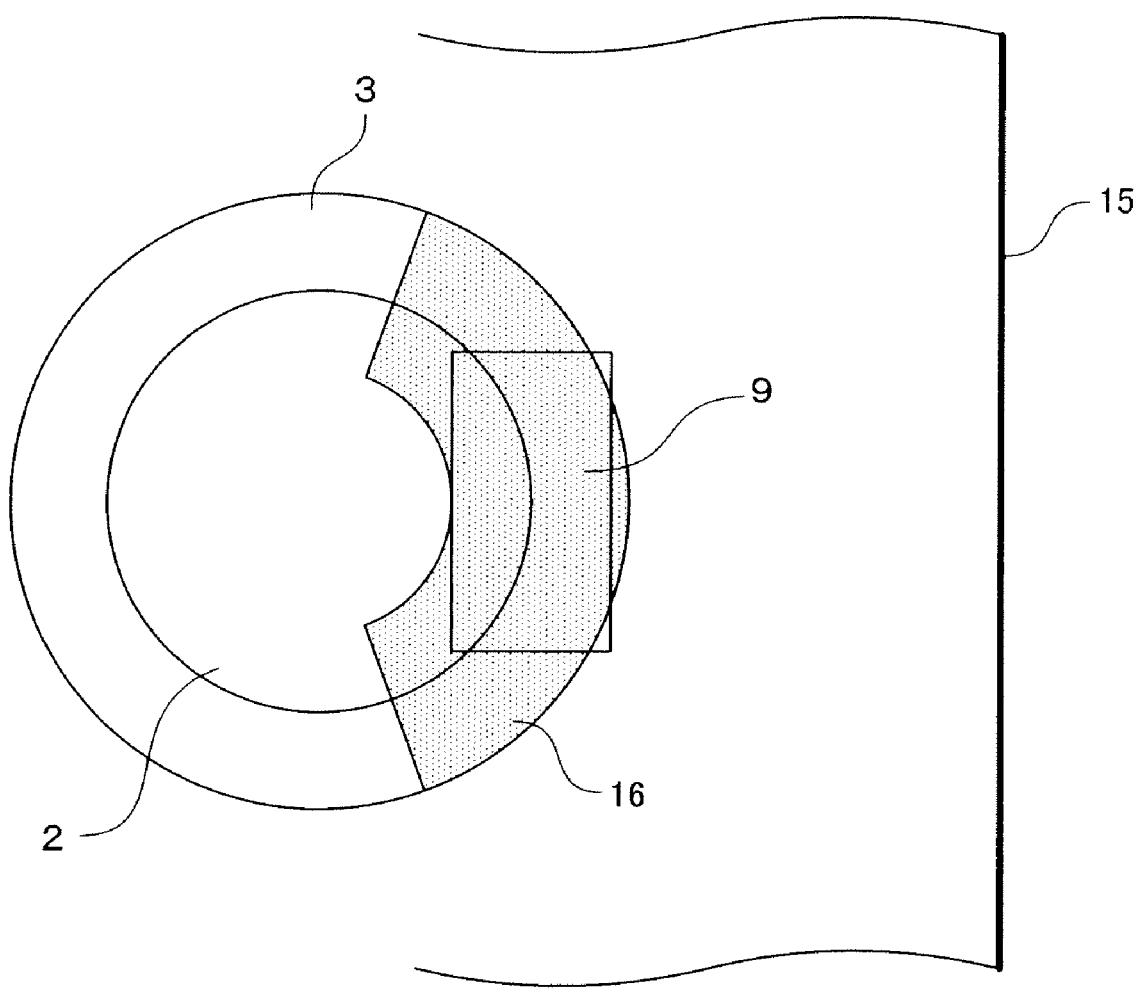
FIG. 8 is a diagram showing the configuration of signal wiring in a signal wiring disposition forbidden region according to a third embodiment.
Figure 9:
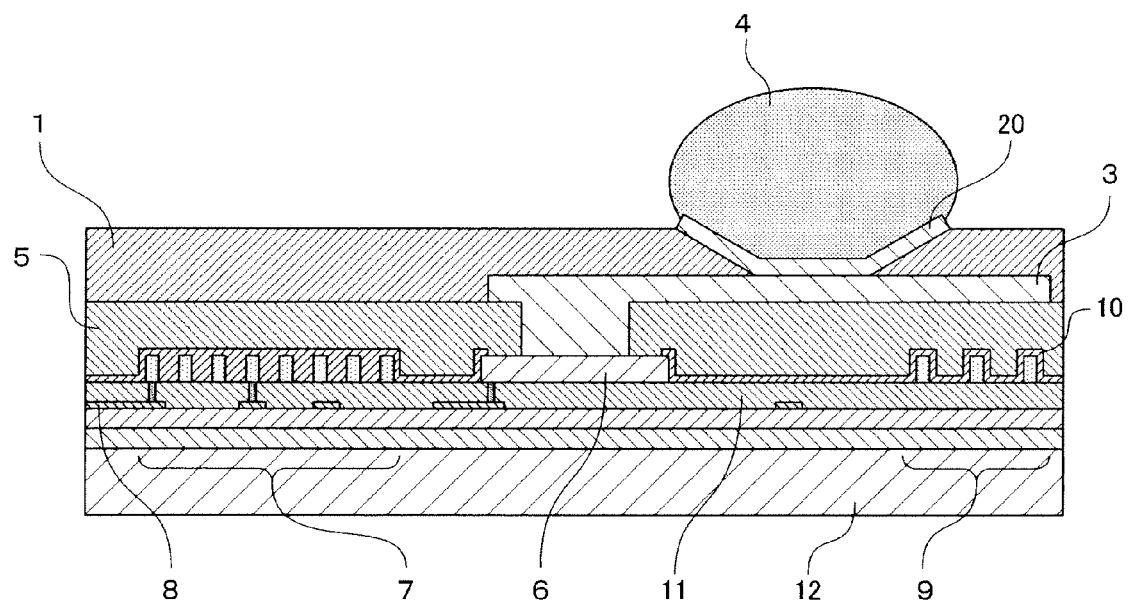
FIG. 9 is a cross-sectional view of substantial parts showing the configuration of a semiconductor device according to a fourth embodiment.

FIG. 1 is a cross-sectional diagram of substantial parts showing the configuration of a semiconductor device according to the present invention. In addition, FIG. 2 is a cross-sectional diagram of substantial parts showing the configuration of the semiconductor device and a corresponding wiring layout plan view. FIG. 3 is a diagram illustrating, within a WLCSP, a signal wiring disposition forbidden region in the semiconductor device according to the present invention; FIG. 4 is a diagram illustrating the proximity of the edge face of the WLCSP in the signal wiring disposition forbidden region in the semiconductor device according to the present invention; and FIG. 5 is a diagram illustrating the signal wiring disposition forbidden region in the semiconductor device according to the present invention. FIG. 6 is a diagram showing the configuration of signal wiring in a signal wiring disposition forbidden region according to a first embodiment. FIG. 7 is a diagram showing the configuration of signal wiring of a signal wiring disposition forbidden region according to a second embodiment. FIG. 8 is a diagram showing the configuration of signal wiring in a signal wiring disposition forbidden region according to a third embodiment. FIG. 9 is a cross-sectional view of substantial parts showing the configuration of a semiconductor device according to a fourth embodiment.

Figure 10:
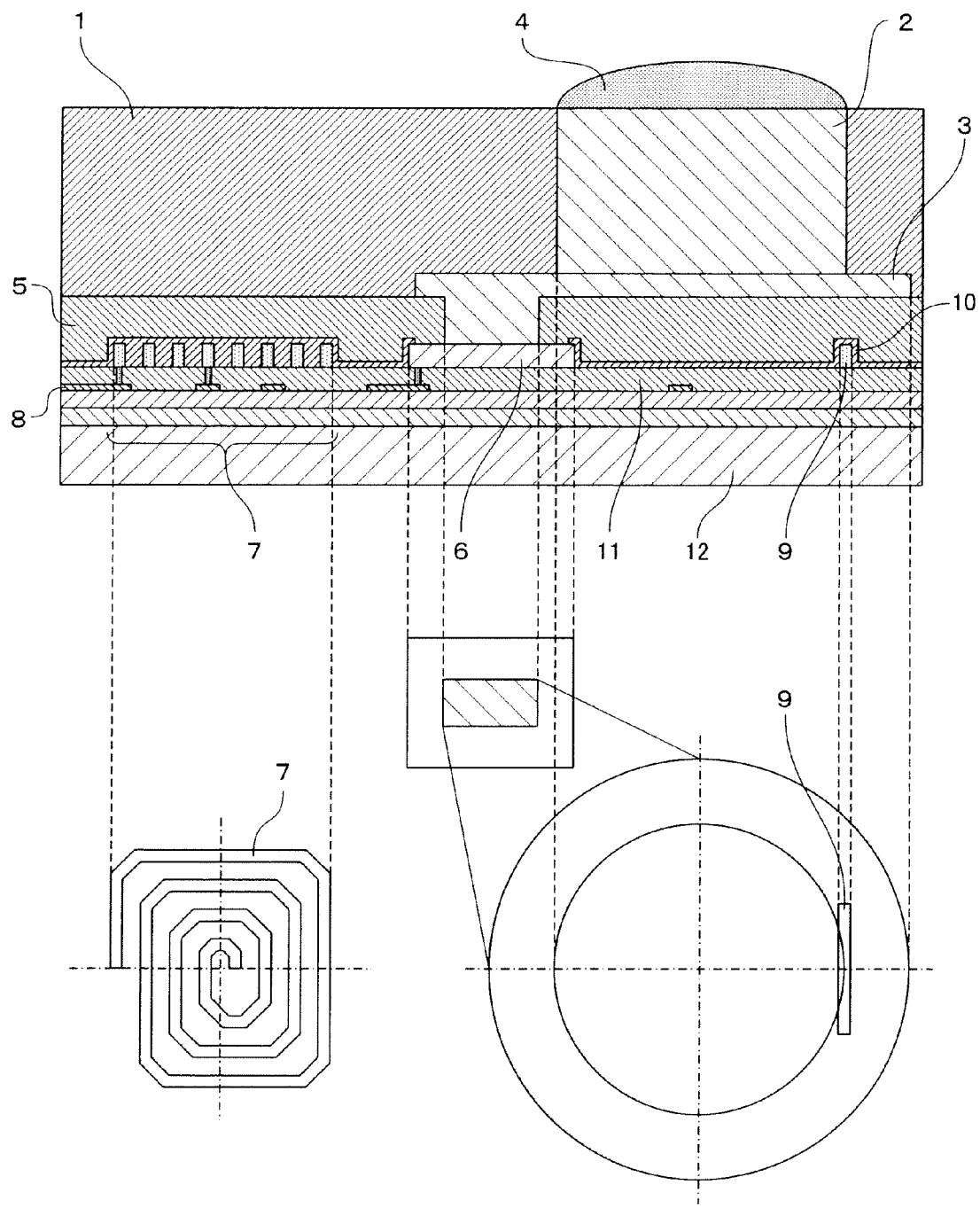
FIG. 10 is a cross-sectional diagram of substantial parts showing the configuration of a conventional semiconductor device and a corresponding wiring layout view.
Figure 11:
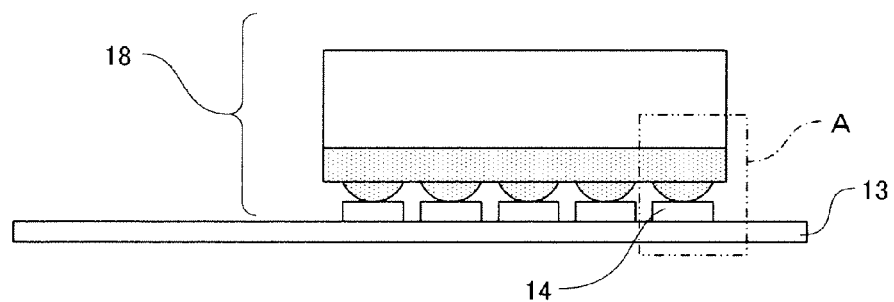
FIG. 11 is a diagram showing a mounted state of a conventional WLCSP.
Figure 12:
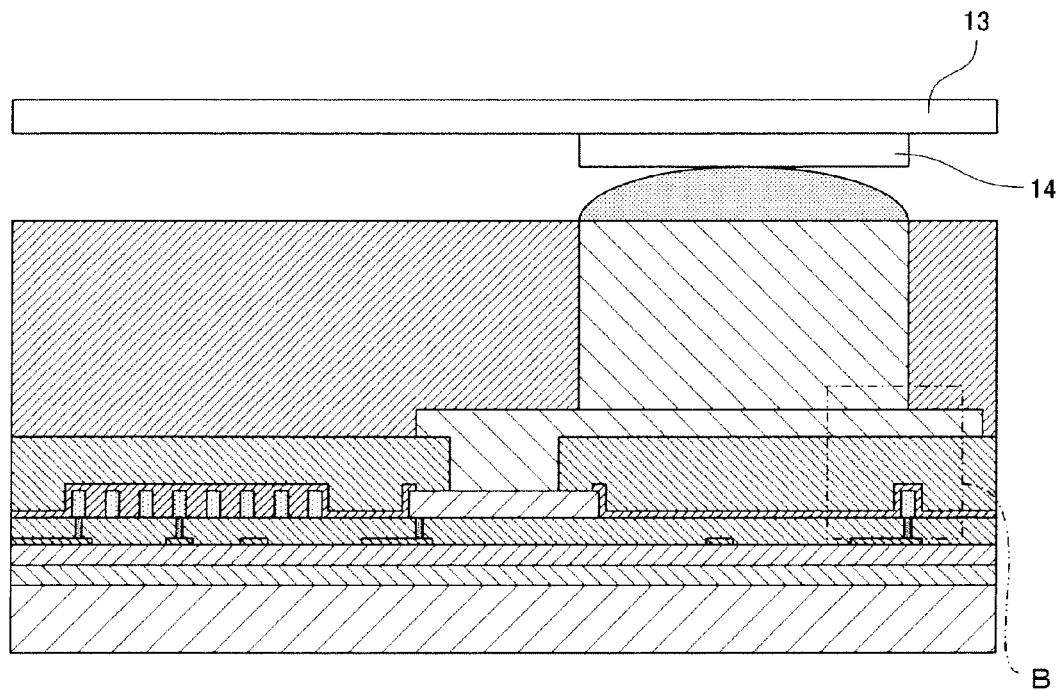
FIG. 12 is an enlarged view of substantial parts showing the mounted state of the conventional WLCSP.
Figure 13:
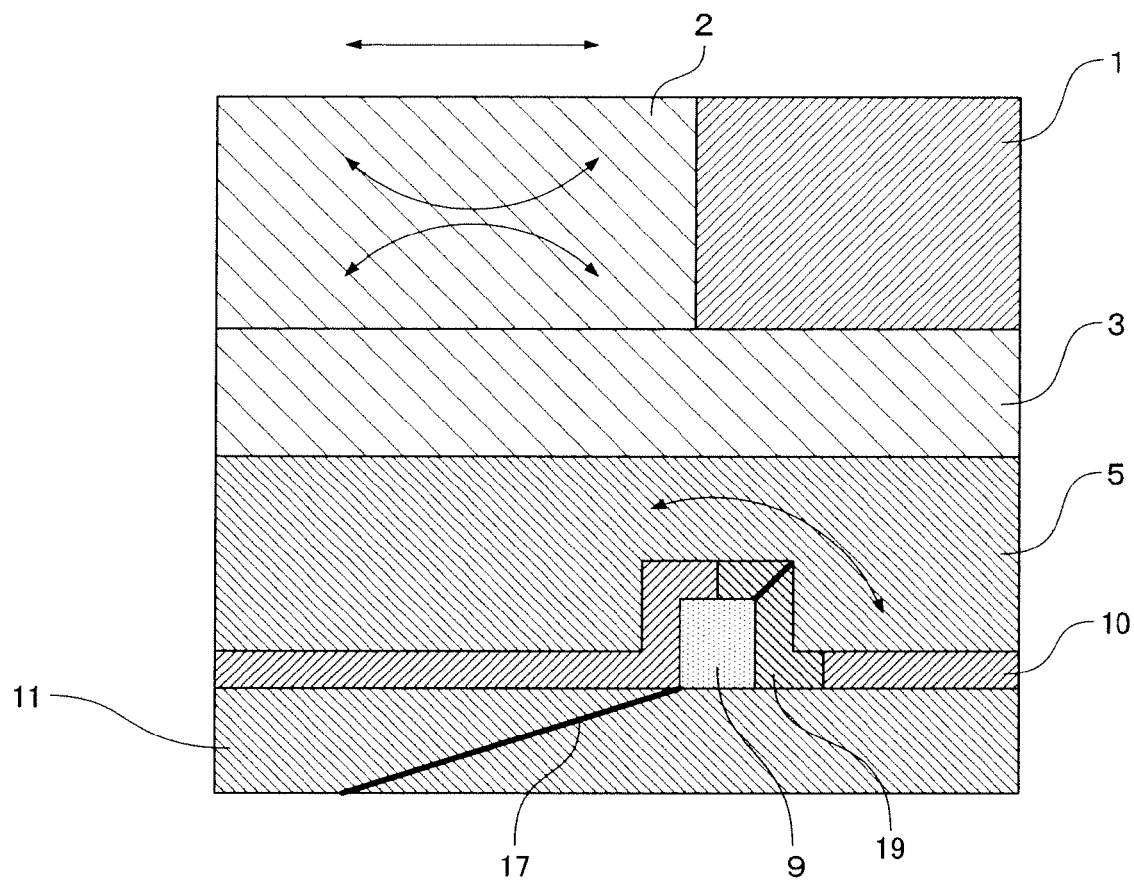
FIG. 13 is a diagram showing a load applied in the vicinity of semiconductor wiring and a stress concentration site during mounting of the conventional WLCSP.

In the diagrams, components corresponding to the components illustrated in FIG. 10 showing the background art described above and having similar functions are represented by the same reference characters.

In FIGS. 1, 2, 3, 4, 5, 6, 7, 8, and 9, reference numeral 1 denotes a molding resin, 2 a post, 3 rewiring, 4 a solder bump having a circular planar shape, 5 an insulating film, 6 an Al wiring pad, 7 an Al wiring inductor, 8 first signal wiring, 9 second signal wiring, 10 a surface protective film, 11 an interlayer insulating film, 12 a semiconductor substrate, 15 a WLCSP lateral face in the vicinity of a formation region of the solder bump 4 of the WLCSP having a surface on which the solder bump 4 is formed, 16 a signal wiring disposition forbidden region, and 20 a UBM (underbump metal film). Among the second signal wiring 9, actual wiring through which electric signals pass is denoted by wiring 9b while dummy wiring through which electric signals do not pass is denoted by wiring 9a and 9c.

As shown in FIGS. 1 and 2, in the semiconductor device according to the present invention, for example, a semiconductor element such as an MOS transistor and a semiconductor element such as a diode and a bipolar transistor formed by a PN junction are formed on the semiconductor substrate 12. The semiconductor substrate 12 is covered by the interlayer insulating film 11 to protect the semiconductor elements. Also disposed on the semiconductor substrate are: the first signal wiring 8 for conducting a signal from the semiconductor element; the second signal wiring 9 provided on the first signal wiring 8 and which is electrically insulated by the interlayer insulating film 11 using a multilayer wiring technique; the Al wiring inductor 7; and the Al wiring pad 6 for extracting signals to the outside. Such components are electrically or atmospherically insulated from the outside and protected by the surface protective film 10. In this case, the wiring material of the second signal wiring 9 desirably includes Al, and in consideration of inductor characteristics, wiring having a thick film thickness of about 1.5 μm or more is used for the second signal wiring 9, the Al wiring pad 6 and the Al wiring inductor 7. In comparison, the surface protective film 10 is thinly formed with respect to the second signal wiring 9.

In addition, wiring is disposed under the solder bump 4 using the rewiring 3 in order to actually extract a signal from the Al wiring pad 6 to the outside. The solder bump 4 and the rewiring 3 are connected via the post 2 for increased mounting reliability. The post 2 and the rewiring 3 are protected from external impact and the atmosphere by the molding resin 1. The solder bump 4 to become a contact that connects to a mounting substrate is formed on the post 2.

In this case, the second signal wiring 9 is disposed directly beneath the outer peripheral section of the post 2. The signal wiring 9b is used for actually transmitting signals. In addition, the signal wiring 9a and 9c is dummy wiring which is not used for signal transmission.

FIG. 3 is a diagram for illustrating which portion of the WLCSP the signal wiring disposition forbidden region 16 corresponds to. FIG. 3A is a perspective view of the entire WLCSP as seen from a solder bump formation plane; FIG. 3B is a drawing showing the WLCSP lateral face portion 15 and the centers of peripheral terminals; FIG. 3C is a drawing showing the signal wiring disposition forbidden region 16 constituted by the WLCSP lateral face portion 15 and the centers of the peripheral terminals; and FIG. 4 is a diagram illustrating, as an enlargement of FIG. 3, a half of the post 2 on a side proximal to the edge of the WLCSP with respect to the signal wiring disposition forbidden region 16.

As shown in FIG. 3, a region between a line connecting the centers of terminals of the outermost periphery of the WLCSP and the WLCSP lateral face 15 is set as the signal wiring disposition forbidden region 16 within the WLCSP.

In other words, as shown in FIG. 4, the signal wiring disposition forbidden region 16 is positioned from the WLCSP lateral face 15 to the center of the post 2.

FIG. 5 is a diagram illustrating a case where a range of the signal wiring disposition forbidden region 16 is further limited and, in order to do so, the post 2 has been extracted. On the WLCSP lateral face 15 or, more specifically, on external terminals of the WLCSP formed by the solder bump 4 proximal to the lateral face of the package (refer to FIG. 1) and the post 2, a perpendicular line is drawn from the WLCSP lateral face 15 to the center point of a planar circle (hereinafter referred to as a planar circle center) on a plane parallel to the semiconductor substrate of the solder bump 4 or, i.e., post 2. A portion at which a fan-shaped region whose center point is the center of the planar circle of the solder bump 4 and which is spread at 70 degrees to the left and to the right from the perpendicular line overlaps with a region whose radius from the planar circle center is 4/5 to 6/5 the radius of the solder bump 4 is assumed to be the signal wiring disposition forbidden region 16.

As shown, while a conventional semiconductor device is a case where the wiring 9b is independently disposed in the signal wiring forbidden region 16 shown in FIGS. 3 to 5, since a stress is no longer directly generated on the wiring 9b and is dispersed to the wiring 9a and 9c by concurrently disposing the wiring 9a and 9c instead of independently disposing the wiring 9b, it is now possible to prevent the protective film 10 around the wiring 9b from being destroyed.

Since a stress during heat treatment can be dispersed by providing the wiring 9b to be used in actual operations and the dummy wiring 9a and the like around the wiring 9b when disposing the second signal wiring 9 in the signal wiring disposition forbidden region 16 at which a stress is generated in a concentrated manner due to heat treatment, the present invention is capable of suppressing occurrences of cracks in a surface protective film used in actual operations without imposing a change in external shape or inducing additional processes or costs.

In this case, the spacing between the actual wiring and the dummy wiring is desirably set so as to be equal to or greater than the wiring width. For example, the spacing is set equal to or greater than 2.0 μm when the wiring width is 2.0 μm. By setting the spacing to be equal to or greater than the wiring width, since a stress is no longer directly generated on the wiring 9b and is dispersed to the wiring 9a and 9c, it is now possible to prevent the protective film 10 around the wiring 9b from being destroyed.

Specific embodiments of the configuration of the second signal wiring 9 in the signal wiring disposition forbidden region 16 will now be described in detail.

First Embodiment

FIG. 6 is a diagram showing the first embodiment. Second signal wiring 9 is disposed in a signal wiring disposition forbidden region 16 in the vicinity of a WLCSP lateral face 15 of a post 2. Among the second signal wiring 9, actual wiring through which electric signals pass is denoted by wiring 9b while dummy wiring through which electric signals do not pass is denoted by wiring 9a and 9c. Due to the disposition of the wiring 9a and 9c through which electric signals do not pass on both sides of the second signal wiring 9b through which electric signals pass, a stress generated in a heat treatment process during mounting of the WLCSP is dispersed to the second signal wiring 9a and 9c, in addition to the second signal wiring 9b, thereby reducing a stress generated independently at the second signal wiring 9b. As a result, a stress is uniformly generated across the entirety of the second signal wiring 9, preventing occurrences of cracks in a surface protective film 10 and enabling a semiconductor device with superior reliability to be provided.

Although an example has been described in which two pieces of dummy wiring are disposed parallel to the actual wiring in-between, only one piece or at least two pieces of dummy wiring may be disposed parallel to the actual wiring.

Second Embodiment

FIG. 7 is a diagram showing the second embodiment. Second signal wiring 9 is disposed in a signal wiring disposition forbidden region 16 in the vicinity of a WLCSP lateral face 15 of a post 2. Among the second signal wiring 9, actual wiring through which electric signals pass is denoted by wiring 9b while dummy wiring through which electric signals do not pass is denoted by wiring 9a. Due to the disposition of the wiring 9a through which electric signals do not pass so as to continuously enclose the periphery of the second signal wiring 9b through which electric signals pass, a stress generated in a heat treatment process during mounting of the WLCSP is dispersed to the second signal wiring 9a, in addition to the second signal wiring 9b, thereby reducing a stress generated independently at the second signal wiring 9b. As a result, a stress is uniformly generated across the entirety of the second signal wiring 9, preventing occurrences of cracks in a surface protective film 10 and enabling a semiconductor device with superior reliability to be provided.

Third Embodiment

FIG. 8 is a diagram showing the third embodiment. Second signal wiring 9 is disposed in a signal wiring disposition forbidden region 16 in the vicinity of a WLCSP lateral face 15 of a post 2. A wiring width of 10 μm or more is secured for the second signal wiring 9 through which electric signals pass and which is to be used in actual operations. Due to the wiring width being 10 μm or more, a stress generated in a heat treatment process during mounting of the WLCSP is dispersed across the 10 μm-width of the second signal wiring 9 compared to a case where the second signal wiring 9 has a typical width of 2 μm. As a result, a stress is uniformly generated across the entirety of the second signal wiring 9, preventing occurrences of cracks in a surface protective film 10 and enabling a semiconductor device with superior reliability to be provided.

In addition, since a stress generated in the lateral direction of the signal wiring can be reduced by setting the wiring width to five times the thickness of the signal wiring, a similar effect can be achieved.

Fourth Embodiment

FIG. 9 is a diagram showing the fourth embodiment. Components similar to those in FIG. 1 are represented by the same reference characters and the description of the components will be omitted.

A WLCSP according to the fourth embodiment is a form not including a post 2 and, in contrast to the WLCSP described above, a solder bump 4 is directly formed on a UBM 20 on rewiring 3 instead of on the post 2.

Even with the WLCSP having such a form as described above, a stress generated in a heat treatment process during mounting of the WLCSP is dispersed by providing dummy wiring 9a or dummy wiring 9c or by securing a wiring width of 10 μm or more for second signal wiring 9 through which electric signals pass and which is to be used in actual operations as was the case with the first to third embodiments. As a result, in the same manner as in the first to third embodiments, occurrences of cracks in a surface protective film 10 can be suppressed and a semiconductor device with superior reliability can be provided.

Similarly, a portion overlapping a region whose radius from the planar center is 4/5 to 6/5 the radius of the solder bump can be set to a range enclosed by an arc whose center is the centroid of an external terminal and whose radius is 4/5 of a minimum distance to the edge of the external terminal and an arc whose center is the centroid of the external terminal and whose radius is 6/5 of a maximum distance to the edge of the external terminal.

What is claimed is:
1. A semiconductor device comprising a substrate, and a wafer level chip scale package structure having external terminals, wherein
    a signal wiring forbidden region on a plane parallel to a substrate principal plane, between a line connecting centroids of adjacent external terminals and an edge of the semiconductor device package, and
    the semiconductor device comprises
        signal wiring in the signal wiring forbidden region and dummy wiring on a same wiring layer in a periphery of the signal wiring,
wherein the signal wiring forbidden region is a region in a range having a fan angle of 140 degrees from the centroid of the external terminal, a center line of the fan angle being perpendicular to the edge of the semiconductor device package and extending to the centroid on the plane parallel to the substrate principal plane, said region overlaps with a range enclosed by an arc whose center is the centroid of the external terminals and whose radius is 4/5 of a minimum distance to an edge of the external terminals and an arc whose center is the centroid of the external terminals and whose radius is 6/5 of a maximum distance to the edge of the external terminals.

2. The semiconductor device according to claim 1, wherein the dummy wiring continuously encloses the periphery of the signal wiring with a gap of 2 μm or more between the dummy wiring and the signal wiring.

3. The semiconductor device according to claim 1, wherein at least one piece of the dummy wiring is parallel to the signal wiring with a gap of at least a width of the signal wiring between the dummy wiring and the signal wiring.

4. The semiconductor device according to claim 1, wherein at least one piece of the dummy wiring is parallel to the signal wiring with a gap of 2 μm or more between the dummy wiring and the signal wiring.

5. The semiconductor device according to claim 1, wherein the plurality of pieces of wiring is made of a material including Al, and has a thickness of 1.5 μm or more.

6. A semiconductor device comprising a substrate, and a wafer level chip scale package structure having external terminals, wherein
a signal wiring forbidden region is on a plane parallel to a substrate principal plane between a line connecting centroids of adjacent external terminals and an edge of the semiconductor device package, and
the semiconductor device comprises
signal wiring in the signal wiring forbidden region and
dummy wiring on a same wiring layer in a periphery of the signal wiring, wherein
the external terminal is formed by a bump whose plane parallel to the substrate principal plane has a circular shape, and
the signal wiring forbidden region is a region between a line connecting a center of the plane parallel to the substrate principal plane of the adjacent bump and the edge of the semiconductor device package.

7. The semiconductor device according to claim 6, wherein a post is provided at a layer underneath the bump.

8. The semiconductor device according to claim 6, wherein an underbump metal film is provided at a layer underneath the bump.

9. A semiconductor device comprising a substrate, and a wafer level chip scale package structure having external terminals, wherein
a signal wiring forbidden region is on a plane parallel to a substrate principal plane between a line connecting centroids of adjacent external terminals and an edge of the semiconductor device package, and
the semiconductor device comprises
signal wiring in the signal wiring forbidden region and
dummy wiring on a same wiring layer in a periphery of the signal wiring, wherein
the external terminal is formed by a bump whose plane parallel to the substrate principal plane has a circular shape, and
the signal wiring forbidden region is a region in which a range having a fan angle of 140 degrees from a center of a planar circle of the external terminals, a center line of the fan angle being perpendicular to the edge of the semiconductor device package and extending to the center of the planar circle of the external terminals, said region overlaps with a range enclosed by an arc whose center is the center of the planar circle and whose radius is 4/5 of a radius of the external terminals and an arc whose center is the center of the planar circle and whose radius is 6/5 of the radius of the external terminals.

10. A semiconductor device comprising a substrate, and a wafer level chip scale package structure having external terminals, wherein
a signal wiring forbidden region is on a plane parallel to a substrate principal plane between a line connecting centroids of adjacent external terminals and an edge of the semiconductor device package, and
signal wiring in the signal wiring forbidden region is set to have a line width at least five times a thickness of the signal wiring.

11. The semiconductor device according to claim 10, wherein
the signal wiring forbidden region is a region in which a range having a fan angle of 140 degrees from the centroid of the external terminals, a center line of the fan angle being perpendicular to the edge of the semiconductor device package and extending to the centroid on the plane parallel to the substrate principal plane, said region overlaps with a range enclosed by an arc whose center is the centroid of the external terminals and whose radius is 4/5 of a minimum distance to an edge of the external terminals and an arc whose center is the centroid of the external terminals and whose radius is 6/5 of a maximum distance to the edge of the external terminals.

12. The semiconductor device according to claim 10, wherein
the external terminal is formed by a bump whose plane parallel to the substrate principal plane has a circular shape, and
the signal wiring forbidden region is a region between a line connecting a center of the plane parallel to the substrate principal plane of the adjacent bump and the edge of the semiconductor device package.

13. The semiconductor device according to claim 10, wherein
the external terminal is formed by a bump whose plane parallel to the substrate principal plane has a circular shape, and
the signal wiring forbidden region is a region in which a range having a fan angle of 140 degrees from a center of a planar circle of the external terminals, a center line of the fan angle being perpendicular to the edge of the semiconductor device package and extending to the center of the planar circle of the external terminals, said region overlaps with a range enclosed by an arc whose center is the center of the planar circle and whose radius is 4/5 of a radius of the external terminals and an arc whose center is the center of the planar circle and whose radius is 6/5 of the radius of the external terminals.

14. The semiconductor device according to claim 12, wherein a post is provided at a layer underneath the bump.

15. The semiconductor device according to claim 12, wherein an underbump metal film is provided at a layer underneath the bump.

16. The semiconductor device according to claim 10, wherein the signal wiring in the signal wiring forbidden region is set to have a line width of 10 µm or more.

17. A semiconductor device having external terminals, wherein
a signal wiring forbidden region is on a plane parallel to a substrate principal plane between a line connecting centroids of adjacent external terminals and an edge of the semiconductor device package, and
the semiconductor device comprises
signal wiring in the signal wiring forbidden region and
dummy wiring on a same wiring layer in a periphery of the signal wiring,
wherein the signal wiring and the dummy wiring are directly beneath the external terminals.

18. A semiconductor device having external terminals, wherein
a signal wiring forbidden region is on a plane parallel to a substrate principal plane between a line connecting centers of the adjacent external terminals of the outmost periphery and an edge of the semiconductor device package, and
the semiconductor device comprises
signal wiring in the signal wiring forbidden region and
dummy wiring on a same wiring layer in a periphery of the signal wiring.

19. The semiconductor device according to claim 17, further comprising:
a semiconductor substrate, and
an interlayer insulating film on the semiconductor substrate, wherein the signal wiring and the dummy wiring are on the interlayer insulating film.

20. The semiconductor device according to claim 19, wherein one of the external terminals comprises a post.

21. The semiconductor device according to claim 20, wherein the post has a circular planar shape.

22. The semiconductor device according to claim 19, wherein a spacing between the dummy wiring and the signal wiring is equal to or greater than 2 µm.

23. The semiconductor device according to claim 19, wherein a spacing between the signal wiring and the dummy wiring is equal to or greater than a width of the dummy wiring.

24. The semiconductor device according to claim 19, wherein at least one dummy wiring is parallel to the signal wiring.

25. The semiconductor device according to claim 19, wherein the dummy wiring is covered with a protective film.

26. The semiconductor device according to claim 18, further comprising:
a semiconductor substrate, and
an interlayer insulating film on the semiconductor substrate, wherein the signal wiring and the dummy wiring are on the interlayer insulating film.

27. The semiconductor device according to claim 26, wherein one of the external terminal comprises a post.

28. The semiconductor device according to claim 27, wherein the post has a circular planar shape.

29. The semiconductor device according to claim 26, wherein a spacing between the dummy wiring and the signal wiring is equal to or greater than 2 µm.

30. The semiconductor device according to claim 26, wherein a spacing between the signal wiring and the dummy wiring is equal to or greater than a width of the dummy wiring.

31. The semiconductor device according to claim 26, wherein at least one dummy wiring is parallel to the signal wiring.

32. The semiconductor device according to claim 26, wherein the dummy wiring is covered with a protective film.

* * * * *